United States Patent [19]

Pramanick et al.

[11] Patent Number: 5,789,310
[45] Date of Patent: Aug. 4, 1998

[54] METHOD OF FORMING SHALLOW JUNCTIONS BY ENTRAPMENT OF INTERSTITIAL ATOMS

[75] Inventors: Shekhar Pramanick, Fremont; Igor C. Ivanov, Pleasanton, both of Calif.

[73] Assignee: Advanced Micro Devices, Inc., Sunnyvale, Calif.

[21] Appl. No.: 763,573

[22] Filed: Dec. 10, 1996

[51] Int. Cl.$^6$ ................................................ H01L 21/265
[52] U.S. Cl. ............................................ 438/528; 306/530
[58] Field of Search .................................. 437/24, 29, 27, 437/40, 41, 247, 950, 959, 40 AS, 41 AS

[56] References Cited

U.S. PATENT DOCUMENTS

| | | |
|---|---|---|
| 5,223,445 | 6/1993 | Fuse .................................. 437/24 |
| 5,374,564 | 12/1994 | Bruel ................................. 437/24 |
| 5,506,167 | 4/1996 | Chen et al. ........................ 437/24 |
| 5,527,724 | 6/1996 | Brady et al. ...................... 437/24 |
| 5,544,024 | 8/1996 | Anjum et al. ..................... 437/24 |
| 5,585,286 | 12/1996 | Aronowitz et al. ............... 437/24 |
| 5,593,673 | 1/1997 | Anjum et al. ..................... 437/24 |

FOREIGN PATENT DOCUMENTS

| | | | |
|---|---|---|---|
| 63-299328 (A) | 12/1988 | Japan | 437/24 |
| 1-255220 (A) | 10/1989 | Japan | 437/24 |
| 6-112158 (A) | 4/1996 | Japan | 437/24 |

OTHER PUBLICATIONS

Raineri, et al., "Secondary Defect Dislocation By Voids", Appl. Phys. Lett., vol. 69, No. 12, Sep. 16, 1996 (pp. 1783–1785).

*Primary Examiner*—John Niebling
*Assistant Examiner*—S. Mulpuri
*Attorney, Agent, or Firm*—Skjerven, Morrill, MacPherson, Franklin & Friel LLP; Edward C. Kwok

[57] ABSTRACT

In the formation of shallow depth junctions, atoms of inner elements, such as helium, argon, xenon or krypton are implanted at a chosen energy and concentration to create microvoids in the epitaxial layer at a chosen depth. Then, upon implantation of boron ions, the implantation of which creates interstitial silicon atoms, during an anneal step the interstitial atoms fill the voids and determine the junction depth.

3 Claims, 1 Drawing Sheet

METHOD OF FORMING SHALLOW JUNCTIONS BY ENTRAPMENT OF INTERSTITIAL ATOMS

FIELD OF THE INVENTION

This invention relates to semiconductor devices, and more particularly, to a method for forming shallow junctions.

BACKGROUND OF THE INVENTION

As is well known, in a typical MOS transistor, source and drain of one conductivity type are formed in a body of opposite conductivity type. As devices continually shrink in size, in order for such devices to operate in the correct electrical mode, it is necessary that the depth of the source and drain in the body, i.e., the junction depth, be reduced also. For example, presently, with a polysilicon gate width of, for example, 0.25μ, junction depth should be on the order of 800 Å.

Typically, in the prior art, achievement of such a small junction depth is problematical, in particular, for example with a p+ region formed using boron ions, as will now be described with regard to formation of said regions in a silicon crystalline layer.

In general, such boron ions are implanted with a chosen energy and a particular dosage necessary to control the concentration. The energy will determine the eventual depth of the junction. With boron being a very light element, in order to attempt to achieve a very shallow junction, it must be implanted at a very low energy. For example, 5 KeV is typically minimum energy for the boron implant.

It has been found, however, that during dopant activation anneal, boron diffusion into the crystalline silicon layer is significantly large, so that the junction depth of the boron tends to be much deeper than planned.

The problem of undefined dopant junction depth occurs because the implantation of the boron ions into the monocrystalline silicon layer causes implantation damage, in turn causing interstitial atoms of silicon to exist, i.e., atoms not in the crystal lattice but between lattice atoms. That is, silicon atoms are displaced from the monocrystalline lattice and are sitting between silicon atoms in the monocrystalline lattice. It has been found that during the high temperature step (also known as dopant activation anneal) described above to diffuse the boron into the monocrystalline silicon layer, boron diffuses by attaching to these interstitial silicon atoms, causing a very rapid diffusion of the boron into the monocrystalline silicon layer. Thus, typically, when boron is implanted into monocrystalline silicon and then an anneal step is undertaken, the dopant profile extends well beyond that desired, for example, $X_j$ depth of 2000 Å or more is formed. This is true even when implanting boron ions at a very low energy (i.e., ~5 KeV).

SUMMARY OF THE INVENTION

The present invention overcomes the above-cited problems by including a step of implanting atoms of an inert element at a chosen energy and concentration to drive these atoms into the silicon epitaxial layer to create microvoids in the epitaxial layer at a chosen depth. Then, upon implantation of boron ions which create interstitial atoms, and an anneal step, the interstitial atoms fill the voids and determine the junction depth.

DESCRIPTION OF THE PREFERRED EMBODIMENT

Figure 1:
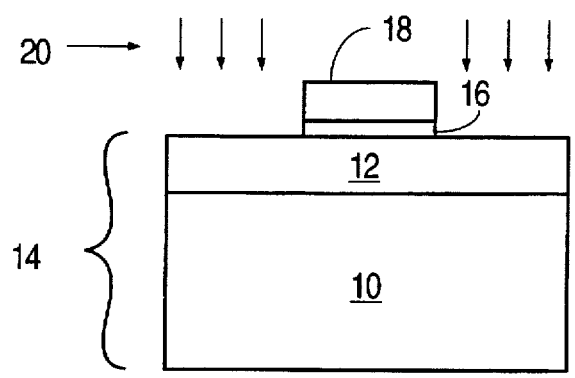
FIG. 1 is a cross-sectional view of a semiconductor device including a silicon substrate having an epitaxial layer form thereon, and showing implantation of inert atoms thereinto.
Figure 2:
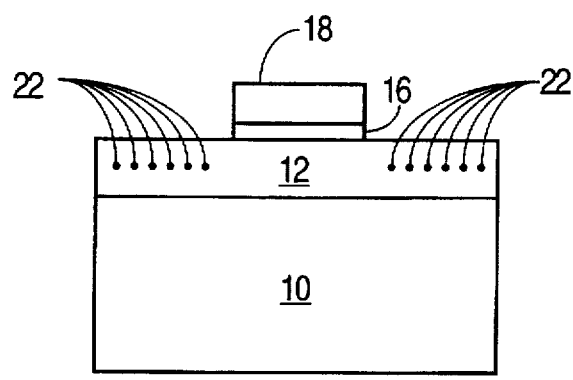
FIG. 2 is a view similar to that shown in FIG. 1 but showing formed microvoids in the epitaxial layer.

Shown in FIG. 1 is an N+ type silicon substrate 10 having N− type epitaxial layer grown thereon as is well known, the doping being, for example, with arsenic or phosphorous. The substrate 10 and epitaxial layer 12 make up a silicon body 14. After formation of the gate oxide 16 and gate 18, an implant step is undertaken, using inert elements such as helium, argon, xenon or krypton 20, at a chosen energy level and a chosen concentration, so that microvoids 22 are created by these individual atoms 20 at a chosen depth (FIG. 2), which, as will be later described, is the ultimate depth of the junction to be formed. Helium is preferred since due to its low mass implantation damage is minimal. Also due to high diffusivity of helium in silicon, helium diffuses out of silicon and allows microvoids to form during the annealing step. Such formation of microvoids 22 is documented in, for example, C. Griffioen et al., Nuclr. Instrum. Methods Phys. Sect. B27,417 (1987), using the implantation of inert elements to so define such voids. The annealing step to form microvoids may be done at temperature range of 400°–800° at various annealing durations. The goal is to achieve 10–20 Å size voids.

Figure 3:
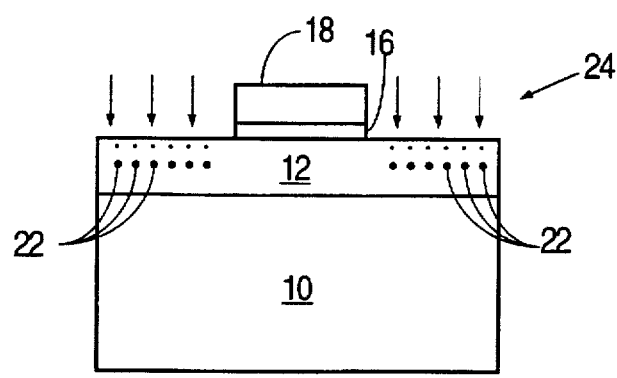
FIG. 3 is a view similar to that shown in FIG. 2 but showing implantation of boron ions.

With reference to FIG. 3, boron ions 24 are then implanted, for example using 5 KeV energy level with the dosage on the order of 1E14 cm$^{-2}$ to 1E16 cm$^{-2}$ (FIG. 3).

Figure 4:
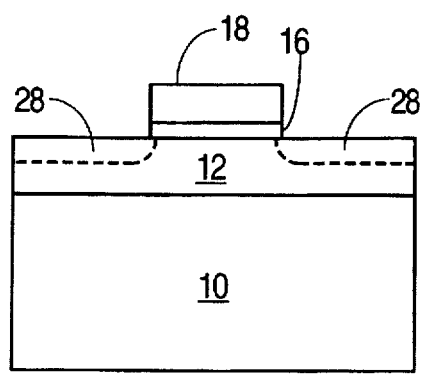
FIG. 4 is a view similar to that shown in FIG. 3 but showing an annealing step, wherein the boron is driven into the epitaxial layer.

Next, the resulting structure is annealed at, for example, a temperature of 1000° for a time period of 20 seconds (FIG. 4).

As is well known, the implantation of the boron ions causes the creation of interstitial silicon atoms, i.e., silicon atoms which sit between atoms in the crystal lattice.

During the anneal step, which is a relatively low-temperature step taken at 800° C. or less, e.g., approximately 500° C. the implanted boron 24 is driven into the epitaxial layer with the interstitial silicon atoms, by the mechanism described above. As this drive-in proceeds, the interstitial atoms move to a depth to fill the microvoids 22 and travel no further, so that the depth of the junctions 28 formed is determined by the initial depth of the microvoids 22.

It will be seen that because of the particular method described, and in particular because of the inclusion of formation of microvoids 22 by inert gas implantation, the diffusion of light weight atoms such as boron reach a chosen depth so as to define a very shallow junction depth in furtherance of the desires of the industry.

We claim:

1. A method of fabricating a source/drain of a semiconductor device comprising:

providing a crystalline silicon body;

implanting into the silicon body atoms of inert gas, so as to create voids in the silicon body at a chosen depth;

implanting boron ions in the silicon body, and creating interstitial silicon atoms in the silicon body;

annealing the resulting structure at a temperature equal or less than 500° C., the voids and interstitial silicon atoms acting together so that interstitial silicon atoms are placed in voids to determine the junction depth of the source/drain.

2. The method of claim 1, wherein said inert gas atoms comprise argon atoms.

3. The method of claim 1, wherein said inert gas atoms comprise Helium atoms.

* * * * *